United States Patent
Teng et al.

(10) Patent No.: US 6,472,777 B1
(45) Date of Patent: Oct. 29, 2002

(54) CAPACITIVE SENSOR CALIBRATION METHOD AND APPARATUS FOR OPPOSING ELECTRO-MAGNETIC ACTUATORS

(75) Inventors: Ting-Chien Teng, Fremont; Bausan Yuan, San Jose, both of CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/524,448

(22) Filed: Mar. 14, 2000

Related U.S. Application Data

(63) Continuation of application No. 09/139,954, filed on Aug. 25, 1998, now abandoned.

(51) Int. Cl.$^7$ ............................................. H02K 41/00
(52) U.S. Cl. ..................... 310/12; 310/684; 324/202; 73/1.79
(58) Field of Search ................ 310/90.5, 68 B, 310/68 C, 12; 324/207.12, 202, 601; 318/135

(56) References Cited

U.S. PATENT DOCUMENTS

| | | | |
|---|---|---|---|
| 3,823,990 A | 7/1974 | Gilinson, Jr. ............. 308/10 |
| 3,860,300 A | 1/1975 | Lyman ..................... 308/10 |
| 4,623,202 A | * 11/1986 | Shingu .................. 310/90.5 |
| 4,629,262 A | 12/1986 | Hamilton ............... 310/90.5 |
| 4,900,962 A | 2/1990 | Hockney et al. ....... 310/90.5 |
| 5,017,819 A | 5/1991 | Patt et al. ............. 310/90.5 |
| 5,093,754 A | 3/1992 | Kawashima ............. 361/144 |
| 5,115,192 A | 5/1992 | Bardas et al. ......... 324/207.12 |
| 5,172,150 A | 12/1992 | Teramoto et al. ......... 354/202 |
| 5,172,160 A | 12/1992 | Van Eijk et al. .......... 355/53 |
| 5,216,590 A | 6/1993 | Ota ..................... 364/167.01 |
| 5,227,948 A | * 7/1993 | Boon et al. ............. 361/144 |
| 5,467,244 A | 11/1995 | Jayawant et al. ........ 361/144 |
| 5,530,306 A | 6/1996 | Ueyama ................. 310/90.5 |
| 5,780,943 A | * 7/1998 | Ono ........................ 310/12 |
| 6,069,417 A | * 5/2000 | Yuan et al. ............... 310/12 |

* cited by examiner

Primary Examiner—Karl Tamal
(74) Attorney, Agent, or Firm—Skjerven Morrill LLP; Norman R. Klivans

(57) ABSTRACT

In a stage assembly, for instance a fine stage using a pair of push-pull electro-magnetic actuators to move the stage back and forth along an axis, there is typically a sensor to determine the actual stage location. This sensor's home position must correspond to the actual stage position where the two opposed actuators are observed to exert forces of the same magnitude but opposing directions on this stage. Since the actuators depend on the sensor reading to exert their forces correctly, misalignment of the home position will decrease system performance. The calibration of this sensor is accomplished using actual system feedback signals, which are the currents drawn by the two opposed actuators, during run time conditions. The sensor is considered calibrated (meaning a virtual "null" position) when each of the two opposed actuators draws the same amount of current. If this is not the case a feedback process calibrates the sensor.

24 Claims, 4 Drawing Sheets

CAPACITIVE SENSOR CALIBRATION METHOD AND APPARATUS FOR OPPOSING ELECTRO-MAGNETIC ACTUATORS

CROSS REFERENCE TO RELATED APPLICATION

This application is a continuation of application Ser. No. 09/139,954, filed Aug. 25, 1998, now abandoned.

BACKGROUND

1. Field of Invention

This invention relates to control systems and more particularly to calibration of a position sensor for a stage having opposed electro-magnetic actuators.

2. Description of the Prior Art

Fine stages are well known and are typically used for instance in the semiconductor field for moving reticles (masks) and wafers. See for instance Trumper U.S. Pat. No. 5,196,745 which discloses a device for controlling the relative position between a movable platen and a stator for example in a 200 to 300 mm range of movement. Such a fine stage is typically used for instance in wafer stepping machines for photolithography and also in other areas, for instance precision machine tools. Such devices typically use an electro-magnetic actuator to drive the stage. These actuators are typically various types of linear motors which provide linear motion along an axis. One type of motor commonly used in such devices is a voice coil motor which provides bi-directional movement along an axis using a principle similar to that of a loud speaker. It is to be appreciated that such fine stages only allow a very small amount of linear motion, as described above.

While voice coil motors provide precision movement, they have the disadvantage of consuming large amounts of electric current and hence producing larger amounts of waste heat. This is undesirable because such heat adversely affects the precision of the metrology (position measurement) which is required in such systems. Such systems often use for instance laser interferometry to measure the actual position of the stage, and the presence of large amounts of heat interferes with the interferometry accuracy and causes the stage structural material to deform due to its thermal expansion property.

Another disclosure, Boone et al. U.S. Pat. No. 5,227,948, discloses a stage which is moved by two opposing electro-magnetic actuators, each of which is an attractive electro-magnetic actuator. This arrangement outputs less heat than does the voice coil motor. One actuator is located at each side of the stage to pull the stage either for instance to the left or the right along the axis of movement.

Such stage assemblies typically include a position sensor which must be calibrated. The position sensor determines the actual location of the stage. The sensor must have a "home" position corresponding to the stage position where the two opposing actuators are observed to exert forces of the same magnitude but opposing directions on the stage. The control system for the actuators depends on the sensor reading to exert force correctly, therefore any misalignment of the sensor home position degrades system performance.

In the prior art typically this actuator/sensor alignment is done through a mechanical adjustment, which has been found to be time consuming and imprecise, especially due to problems of drift due for instance to thermal or other affects. This both degrades performance and reduces system throughput, since time is required for the actual calibration. An improved calibration method would be very desirable for such systems.

SUMMARY

In accordance with this invention, a position sensor is calibrated using a self-alignment process, e.g. during the system startup. The self-alignment calibration is performed based on actual system feedback signals during "run time" conditions, which allows the system to calibrate itself to match the alignment positions. Such calibration is fast, precise and transparent to the user since it is performed automatically. Such an alignment is implemented e.g. through software implemented in the system controller.

In accordance with the invention therefore the self calibration takes place by determining first the sensed position of the stage (or other movable object to be located). The corresponding electric currents drawn by each of the two opposing actuators are measured and compared. If the two currents are equal, that indicates that the system is calibrated; in other words the stage is in its center "null" (or home) position. If either current is greater than the other, this indicates that the stage is off center and the stage is then moved back towards the center position in accordance with the relative currents. Feedback is provided whereby the position is measured and the corresponding actuator currents compared until the currents are equal, resulting in the stage being at the calibrated null position.

In one embodiment the actuators are E/I core actuators which are well known electro-magnetic devices and the sensor is a capacitive sensor which measures the E-I core gap in each of the actuators. However this is not limiting and this method and apparatus are applicable to systems having other types of opposed electro-magnetic actuators and sensors.

DETAILED DESCRIPTION

E/I core actuators are well known; They are a type of electro-magnetic linear motor so named because they consist of two main components. The first component is the E core which is a structure, for instance of iron, having a shape of a letter E with an insulated electric coil wire wound around the center bar of the E and a source of current supplying current to the coil. This creates an intense electro-magnetic field which attracts an associated I shaped core, which is also formed for instance of iron. Thus an electro-magnetic force is exerted across the width of a gap between the E and the I core. Typically in use the E core is attached to a framework and the I core is attached to (or is) a side of a stage which is thereby attracted to the E core. This drives movement of this stage. Of course these relationships can be reversed and the I core can be the fixed portion and the E core the moveable portion, depending on the application. For description of an E/I core actuator and an associated control system see copending commonly owned U.S. application Ser. No. 09/139,954, now U.S. Pat. No. 6,069,417 entitled "Stage Having Paired E/I Core Actuator Control", incorporated herein by reference in its entirety.

E/I core actuators are used because, unlike for instance a bi-directional voice coil motor which also provides precision positioning, E/I core actuators use substantially less electric current and therefore output less waste heat and are better, as described above, for systems using interferometry for position measurement. However as described above since E/I core actuators are only attractive devices one must use them in opposed pairs so that they operate in a push-pull configuration, one located on each side of the stage to pull the stage back and forth along an axis.

Figure 1:
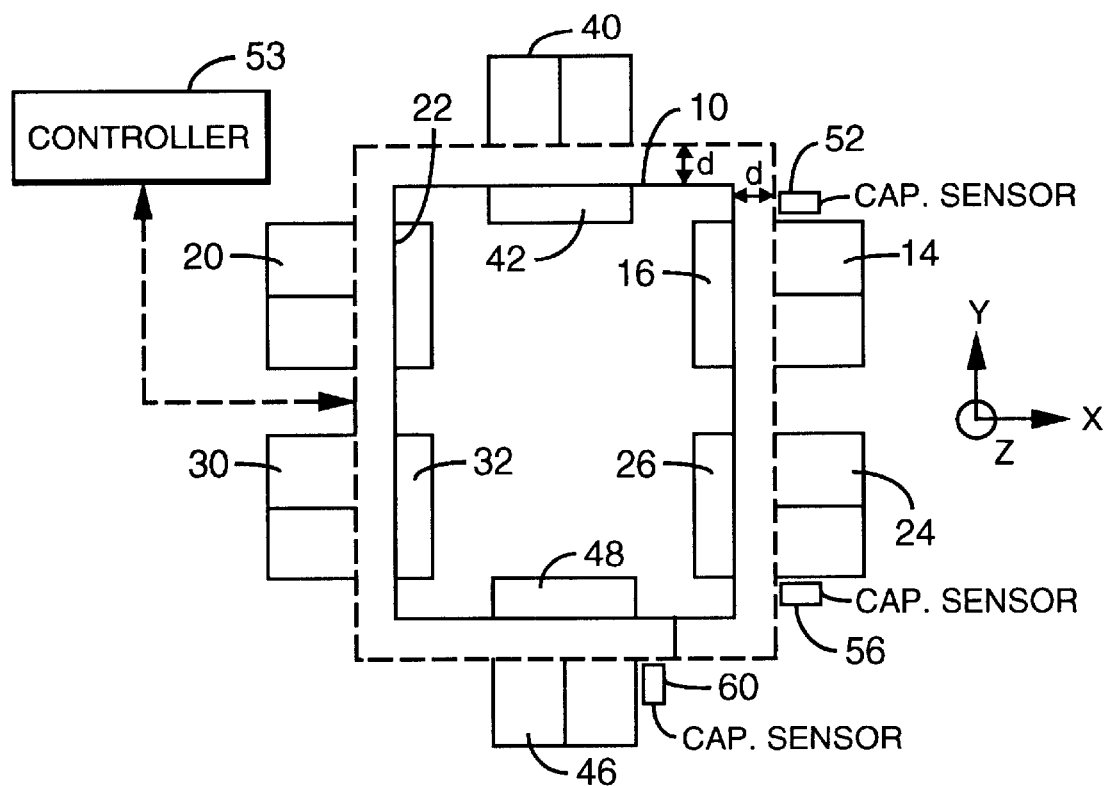
FIG. 1 shows a plan view of a system in accordance with this invention.

FIG. 1 shows a simplified plan view of such a stage assembly including a stage 10 which typically moves on a base (not shown) and which is supported by a bearing system, such as roller bearings or air bearings, as is conventional. The base typically includes guide rails or a guide structure to constrain movement of the stage 10 along the axis. Note that the stage 10 may be a fine stage where the base is a coarse stage (not shown). This is typically because the fine stage of FIG. 1 only provides a maximum movement of perhaps as little as 400 micrometers, for fine adjustments.

The Y and X axis are illustrated in FIG. 1 for purposes of orientation. In this case the stage 10 is capable of movement in both the X and Y directions. The X direction movement is driven by two pairs of E/I core actuators. The first actuator includes E core 14 and associated I core 16 which is the side of (or mounted on the side of) stage 10. The associated coils and current source are not shown but are conventional. The opposing actuator includes E core 20 and I core 22. Thus this pair of actuators drives movement back and forth in the X direction. In this particular example there are two pairs of actuators providing movement in the X direction, the second pair including E core 24 and associated I core 26 and E core 30 and associated I core 32. The arrangement of two pairs on each side is to provide both linear and rotational motion.

Also shown in this example, for movement along the Y direction axis, is another pair of E/I core actuators where the first actuator includes E core 40 and I core 42 and the opposing actuator includes E core 46 and I core 48. Of course this configuration provides three (two linear and one rotation) degrees of freedom. It is also possible to have a stage with only two degrees of freedom or six degrees of freedom, the other degrees of freedom being in the Z axis (vertical direction). (Such Z axis actuators are not shown here for purpose of simplicity.)

Also provided are capacitive sensors for measuring the spacing (gap) between the E core and the I core for a particular actuator. FIG. 1 shows sensors 52 and 56 for sensing respectively the gap between E and the I core for the actuator 14, 16 and the actuator 24, 26. A second capacitive sensor 60 is associated with the E/I core 46, 48. These are e.g. conventional capacitive distance sensors operating over a very small distance. The typical E-I core gap here in the central (null) position (distance D) is almost 1 mm. Therefore the total travel of this stage 10 in either the X or the Y directions is only approximately 2 mm.

Figure 2:
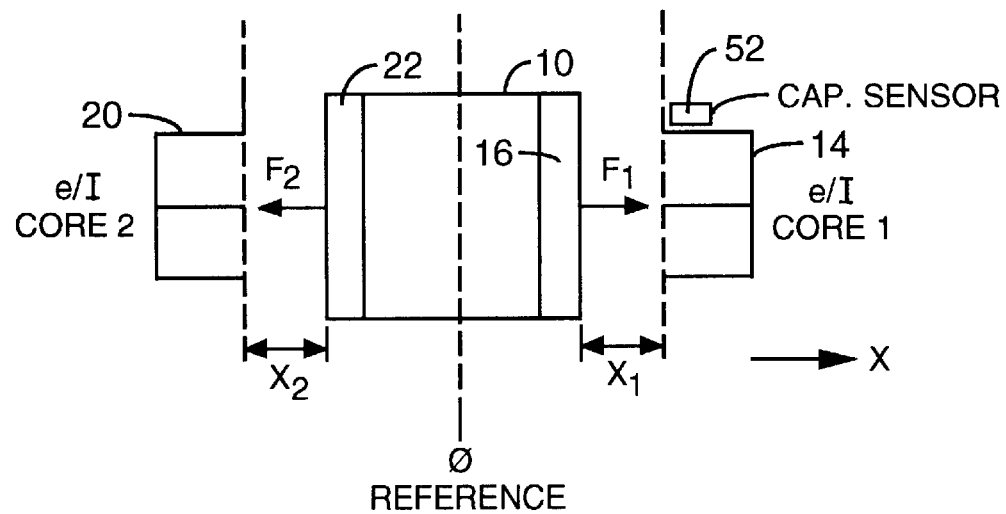
FIG. 2 shows operation of the system of FIG. 1.

Operation of this stage assembly is shown in FIG. 2, which shows for simplicity the stage 10 and only the first pair of X direction movement actuators; hence FIG. 2 shows only a portion of the structure of FIG. 1. Also shown in FIG. 2 is a reference centerline (null position) for purpose of orientation. This centerline is not a structural element but is an indication of the center of the travel of the stage 10 where the stage is half way between the opposing actuators. In such a system the "home" position of the capacitive sensor 52 must correspond to the associated stage 10 center position where the two actuators are observed to exert forces of the same magnitude but opposing directions on the stage 10. These forces are illustrated as forces F1 and F2 in FIG. 2.

Each actuator depends on the associated capacitive sensor reading to exert force correctly; therefore any misalignment of the home position of the stage 10 decreases system performance, and hence accurate calibration of the sensor 52 is important. As described above, this is accomplished by a self-alignment process, without requiring mechanical adjustment, and which can be accomplished during run time conditions, for instance when the system is first powered up. It can also be performed periodically during actual, for instance lithography, operations when no exposures are being undertaken.

For simplicity in FIG. 2 the right hand E/I core actuator is labeled core 1 and the left hand E/I core actuator is labeled core 2. The following equations explain operation of this device where F1 refers to the force generated by the current $I_1$ drawn by E/I core actuator 1 and F2 refers to the force generated by the current $I_2$ drawn by E/I core actuator 2:

$$F_1 = K_1 \left(\frac{I_1}{X_1}\right)^2, F_2 = K_2 \left(\frac{I_2}{X_2}\right)^2.$$

When F1=F2, meaning the stage 10 is not moving, the ideal condition is $X_1=X_2=X_0$, $I_1=I_2$, so $F_1=F_2=F_0$ and $K_1=K_2$. However in real conditions, without precise alignment and due to various constraints (e.g. material difference, parts quality, etc.) when $F_1=F_2$, for real conditions where $X_1 \neq X_2$, and $I_1 \neq I_2$ and $K_1 \neq K_2$:

$$F_1 = K_1 \left(\frac{I_0 + \Delta I_2}{X_0 + \Delta X_2}\right)^2, F_2 = K_1 \left(\frac{I_0 + \Delta I_2}{X_0 + \Delta X_2}\right)^2$$

where, $X_1=X_0+\Delta X_1$, $X_2=X_0+\Delta X_2$ and $I_1=I_0+\Delta I_1$, $I_2=I_0+\Delta I_2$, and $K_1 \approx K_2$.

Hence precise alignment of the sensor is important. This is accomplished in accordance with the invention by a process shown in FIG. 3. It is to understood that this process is typically carried out by a microprocessor (or microcontroller) 53 (FIG. 1) which is properly programmed and typically resident in such a system for purposes of controlling the E/I core actuators. Specifically this microprocessor is part of a feedback loop controlling the actuators (for instance see the above-mentioned patent application), of a largely conventional type which measures the position of the stage and feeds it back so that the stage reaches its intended position.

Figure 3:
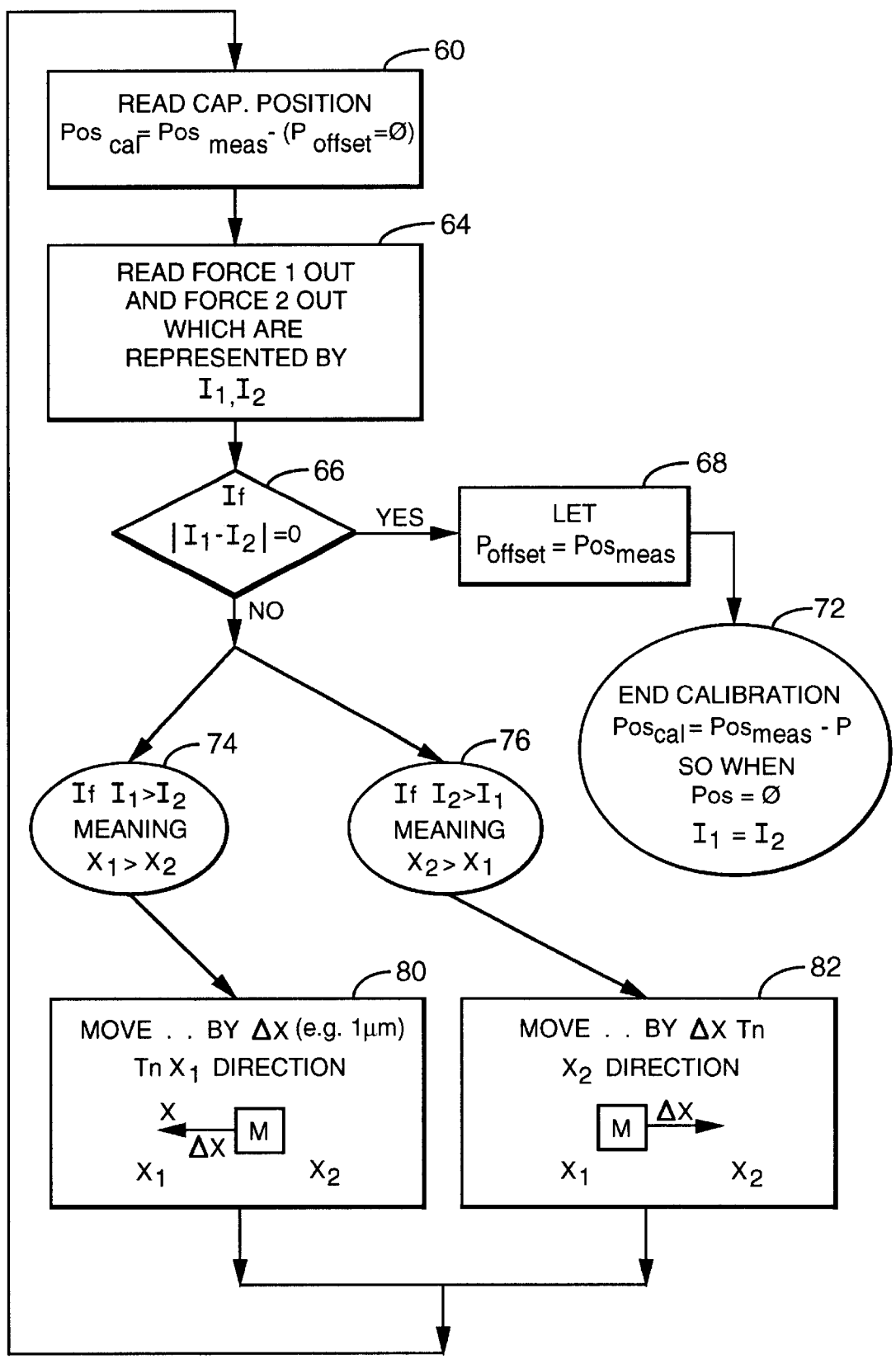
FIG. 3 is a flow chart showing the calibration process in accordance with this invention.

This control system is used in accordance with the process shown in FIG. 3 to calibrate the stage position sensors. While the disclosed position sensors are of the well known capacitive type, this is not limiting. Other types of sensors may also be used. Also, while the disclosed embodiment uses E/I core actuators, this also is not limiting and one may substitute other types of push-pull electro-magnetic actuators.

In the process of FIG. 3, in the first step 60 the stage position (measured for instance by the sensor 52 shown in FIG. 2) is read out so the calibrated position is equal to the measured position minus the offset reference position which is preset as zero initially. In the next step 64, the currents $I_1$ and $I_2$ which are being sourced to respectively E/I core actuator 1 and E/I core actuator 2 are used to calculate the respective forces depicted as F1 and F2 in FIG. 2. This calculation is performed using the above described equations, where as shown force equals a constant times the square of the current divided by a square of the gap between the E and I core.

In the next step 66 a comparison is made if the currents $I_1$ $I_2$ are equal or not. If they are equal, control passes to step 68 and the determined (measured) position, which is the new offset reference position, is the currently measured referenced position from step 60; in other words, the sensor is properly calibrated at the null position. At this point one ends the calibration at step 72 so that the current calibrated position equals the measured position minus the new offset reference position. Therefore, when the calibrated position is at zero, I1 is equal to I2, in other words the stage is at its central "null" position.

If the comparison step 66 yields a "no" result, in other words I1 does not equal I2, control passes to steps 74 and 76 to determine which of the currents $I_1$, $I_2$ is greater. In step 74 it is determined that I1 is greater, meaning the distance X1 depicted in FIG. 2 is greater than distance X2. (As explained above, there is inverse relationship between the current and distance in order to produce a particular force.) Similarly the determination is made in step 76 that in the case of I2 being greater than I1, then this means that distance X2 is greater than distance X1.

Steps 74 and 76 respectively pass control to steps 80 and 82. In steps 80, 82 the stage 10 is moved the appropriate distance in either the left or the right directions as depicted. Then control is returned from either of steps 80 and 82 to step 60 to again measure the position. This process is repeated until the comparison 66 is satisfied. This process is carried out relatively quickly, requiring perhaps only a few seconds, and is typically performed when the stage assembly is first powered up, or can be performed at other times during operation of the stage.

Of course one does not require a microprocessor or microcontroller to carry out the functions of FIG. 3, but this process may be performed for instance by hard wired circuitry or other control circuitry instead. It could also be performed by a computer rather than a microprocessor or microcontroller.

Figure 4:
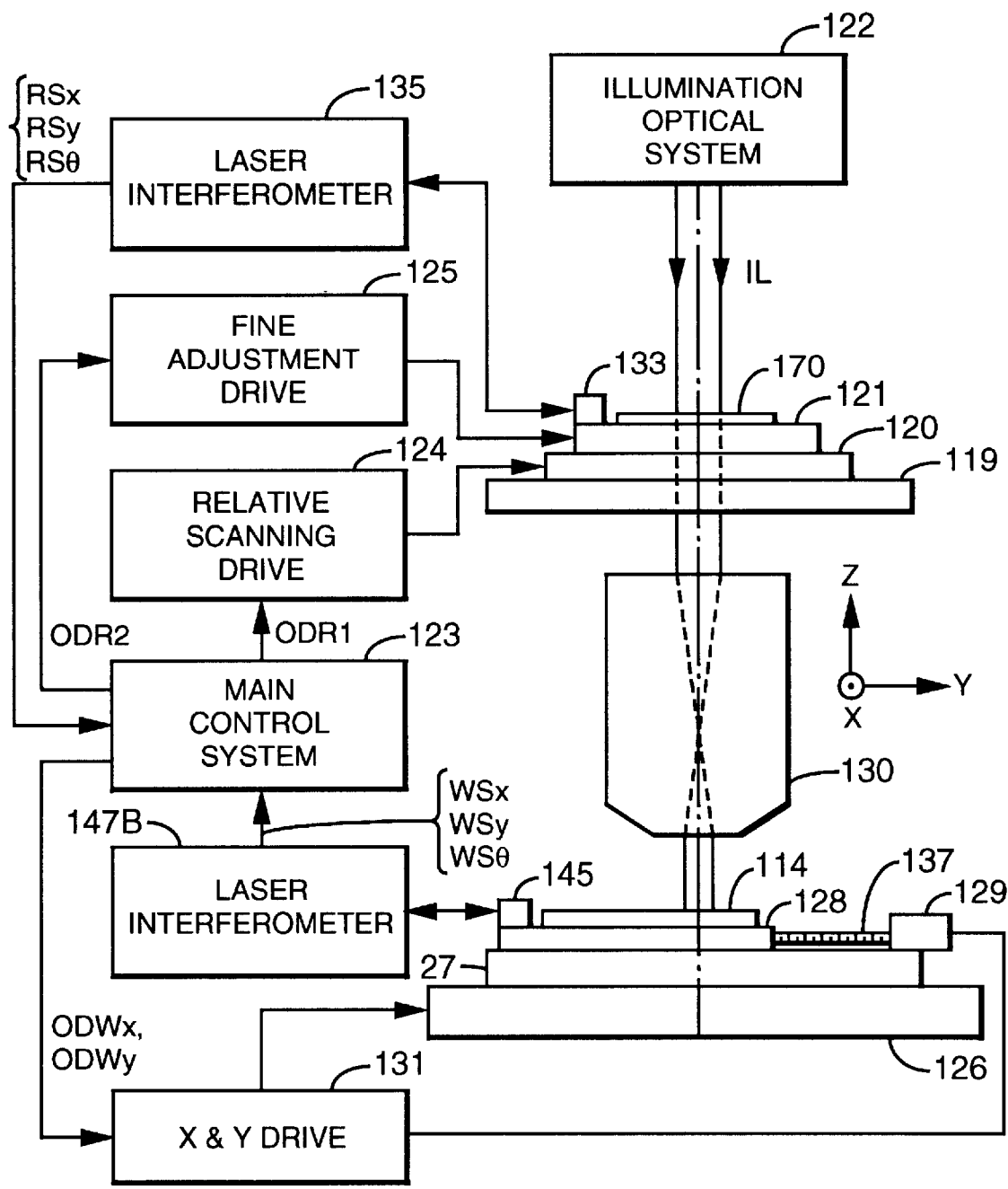
FIG. 4 shows a lithographic system in which the present actuator system is used.
Figure 5:
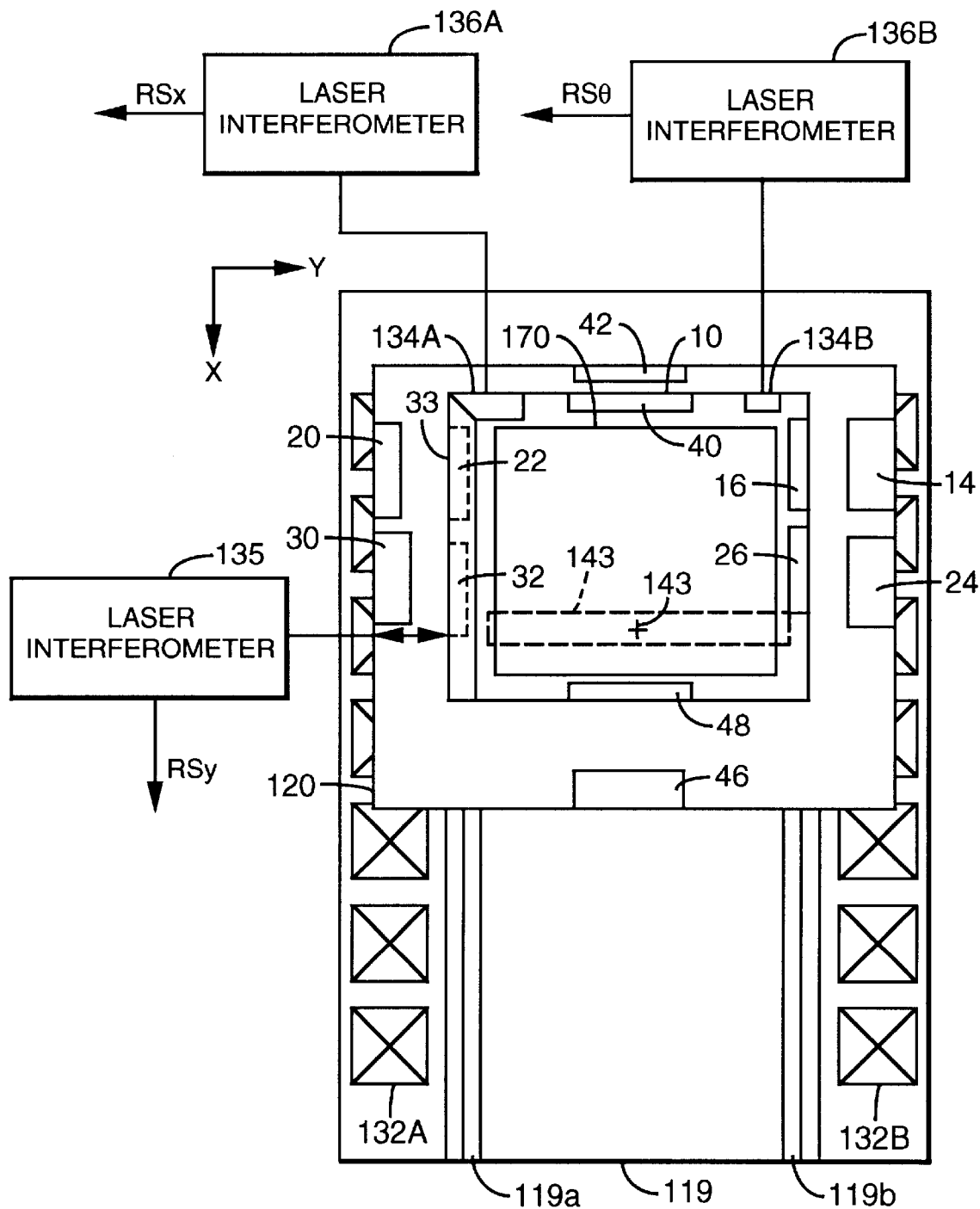
FIG. 5 shows detail of the FIG. 4 system.

An application of the present invention is in a projection exposure apparatus as shown in FIG. 4, which is from U.S. Pat. No. 5,477,304 to Nishi, incorporated herein by reference; for a description of the elements see Nishi, FIG. 1. Present FIG. 5 is similar to Nishi FIG. 2, but substitutes the E-I core actuators of present FIG. 1 for the actuators and springs of Nishi FIG. 2 operating on stage 10. due to the conventionality of the other elements of FIGS. 4 and 5 no further disclosure is provided herein.

Present FIG. 4 (corresponding to FIG. 1 of Nishi) shows a reticle 170. There is a reticle side scanning stage 120 placed on the reticle side base 119. A reticle side fine adjustment stage 121 is placed on the reticle side scanning stage 120. The reticle 170 is held on the reticle side fine adjustment stage 121. There is an illumination optical system 122. Three movable mirrors (only one movable mirror 133 is shown in FIG. 4) are disposed on the reticle side fine adjustment stage 121. There are three laser interferometers (only one laser interferometer 135 is shown in FIG. 4) obtain the positions and rotational angles of the reticle side fine adjustment stage 121 by using laser beams. The measurement results obtained by these laser interferometers are supplied to a main control system 123. The main control system 123 controls the operation of the reticle side scanning stage 120 through a relative scanning drive 124 and also controls the operation of the reticle side fine adjustment stage 121 through a fine adjustment drive 125.

In an exposure operation, a pattern and a slit like illumination area on the reticle 170 is projected/exposed on the wafer 114 through the projection optical system 130. In a stage system for the wafer 114, an air guide elongated in the x direction as shown is formed on a wafer side base 126 and a wafer side x stage 127 is placed on the wafer side base 126 to be slidable in the x direction within the x-y plane. A wafer side y stage 128 is placed on the wafer side x stage 127 to be movable in the y direction. The wafer 114 is held on the wafer side y stage 128. A stepping motor 129 is disposed on one end of the wafer side x stage 127 which drives the wafer side y stage 128 in the y direction through a ball screw 137.

Three movable mirrors (only one of which 145 is shown in FIG. 4) are disposed on the wafer side y stage 128. Three laser interferometers (only one laser interferometer 147b is shown in FIG. 4) obtain the positions and rotational angles of the wafer side y stage 128 within the x-y plane by using laser beams reflected by the three movable mirrors. The measurement results obtained by the laser interferometers are also supplied to the main control system 123. The main control system 123 controls the operations of the wafer side x stage 127 and the wafer side y stage 128 through a drive 131.

In FIG. 5 there is shown a plan view showing a reticle stage system for the FIG. 4 system. Two pairs of air guides 119a and 119b are formed in rows on the reticle side base 119 to extend in the x direction. Electromagnets 132A and 132B are embedded on two sides of the air guides 119a and 119b in rows in the x direction. Permanent magnets are embedded in the rear surface of the reticle side scanning stage 120 so that the reticle side scanning stage 120 is driven in the x direction by a linear motor. A cooling function is provided for the reticle side scanning stage 120 to prevent heat generated by the linear motor from being conducted to the reticle side fine adjustment stage 121. The reticle side fine adjustment stage 121 is placed on the reticle side scanning stage 120. The movable mirror 133 having a reflecting surface perpendicular to the y axis and elongated in the x direction is disposed on an end portion of the reticle side fine adjustment stage 121 in the y direction. Movable mirrors 134A and 134B each having a reflecting surface perpendicular to the x axis are disposed on two end portions of the reticle side fine adjustment stage 121.

The y-axis laser interferometer 135 is fixed on the reticle side base 119 to oppose the movable mirror 133. Similarly, an x-axis laser interferometer 136A is fixed on the reticle side base 119 to oppose the mirror 134A. The laser interferometer 136B for rotation measurement is fixed on the reticle side base 119 to oppose the movable mirror 134B. A y coordinate data RSy, x-coordinate data RSx, and rotational angle data RSθ of the reticle side fine adjustment stage 121, which are respectively obtained by the y-axis laser interferometer 135, the x-axis laser interferometer 136A and the rotation measurement laser interferometer 136B, are supplied to the main control system 123 in FIG. 4.

The other elements illustrated in FIG. 5 are as in FIG. 4. Note there is also illustrated a slit like illumination area 43 elongated in the y direction found on the reticle 117 by the exposure light IL from FIG. 4. The optical axis of the y-axis laser interferometer 135 is set on a straight line which passes a center 143A of the illumination area 43 and is parallel to the y axis.

This disclosure is descriptive and not limiting: further modifications will be apparent to one skilled in the art in light of this disclosure and are intended to fall within the scope of the appended claims.

We claim:

1. In a positioning system having a stage driven along an axis by two opposing electro-magnetic actuators, each actuator drawing an electric current, a method far calibrating a sensor which senses a position of the stage along the axis, comprising:

(a) sensing a position of the stage using the sensor;

(b) determining if each of the two actuators are drawing equal amounts of current at the sensed position, and if so, ending the calibration;

(c) if not, moving the stage along the axis position, and returning to (a).

2. The method of claim 1, wherein (c) includes determining which current is greater and moving the stage accordingly.

3. The method of claim 1, wherein (a) includes sensing capacitive.

4. The method of claim 1, wherein (a) includes sensing a width of a gap between an E core and associated I core of each of the actuators.

5. The method of claim 1, wherein (b) includes ending the calibration when the stage is stationary.

6. The method of claim 1, wherein the stage is in a projection exposure apparatus.

7. A stage assembly comprising:

a stage movable along an axis;

a pair of opposing actuators each drawing an electric current and positioned to drive the stage along the axis;

a sensor located to sense a position of the stage along the axis; and a controller coupled to the actuator to control the electric current to the actuators and coupled to the sensor, wherein the controller calibrates the sensor relative to the stage position by measuring the current drawn by each actuator.

8. The assembly of claim 7, wherein each actuator is an E/I core actuator and the sensor senses a width of a gap between the E core and the I core of each actuator.

9. The assembly of claim 7, wherein the controller determines which current is greater and moves the stage accordingly.

10. The assembly of claim 7, wherein the sensor is a capacitive sensor.

11. The assembly of claim 7, wherever the controller determines the calibration is complete when the currents are equal.

12. The assembly of claim 7, wherein the stage assembly is part of a projection exposure apparatus.

13. In a positioning system having a stage driven along an axis by two opposing electro-magnetic actuators, each actuator drawing an electric current, a method for calibrating a home position for a sensor which senses a position of the stage along the axis, comprising:

(a) sensing a position of the stage using the sensor;

(b) determining if each of the two actuators are drawing equal amounts of current at the sensed position, and if so, setting the sensed position as the home position and ending the calibration;

(c) if not, moving the stage along the axis, and returning to (a).

14. The method of claim 13, wherein (c) includes determining which current is greater and moving the stage accordingly.

15. The method of claim 13, wherein (a) includes sensing capacitive.

16. The method of claim 13, wherein (a) includes sensing a width of a gap between an E core and associated I core of each of the actuators.

17. The method of claim 13, wherein (b) includes ending the calibration when the stage is stationary.

18. The method of claim 13, wherein the stage is in a projection exposure apparatus.

19. A stage assembly comprising:

a stage movable along an axis;

a pair of opposing actuators each drawing an electric current and positioned to drive the stage along the axis;

a sensor located to sense a position of the stage along the axis; and a controller electrically coupled to the actuator to control the electric current to the actuators and electrically coupled to the sensor, wherein the controller calibrates the sensor to a home position relative to the stage position by measuring the current drawn by each actuator.

20. The assembly of claim 19, wherein each actuator is an E/I core actuator and the sensor senses a width of a gap between the E core and the I core of each actuator.

21. The assembly of claim 19, wherein the controller determines which current is greater and moves the stage accordingly.

22. The assembly of claim 19, wherein the sensor is a capacitive sensor.

23. The assembly of claim 19, wherever the controller determines the calibration is complete when the currents are equal.

24. The assembly of claim 19, wherein the stage assembly is part of a projection exposure apparatus.

* * * * *